(12) United States Patent
Williams et al.

(10) Patent No.: US 6,858,253 B2
(45) Date of Patent: Feb. 22, 2005

(54) METHOD OF MAKING DIMENSIONALLY STABLE COMPOSITE ARTICLE

(75) Inventors: Todd R. Williams, Lake Elmo, MN (US); Olester Benson, Jr., Woodbury, MN (US)

(73) Assignee: 3M Innovative Properties Company, Saint Paul, MN (US)

(*) Notice: Subject to any disclaimer, the term of this patent is extended or adjusted under 35 U.S.C. 154(b) by 34 days.

(21) Appl. No.: 09/871,421

(22) Filed: May 31, 2001

(65) Prior Publication Data

US 2003/0059578 A1 Mar. 27, 2003

(51) Int. Cl.[7] .............................. B05D 3/12; B05D 3/06
(52) U.S. Cl. ...................... 427/277; 427/355; 427/553; 427/557
(58) Field of Search ................. 427/271, 277, 427/278, 355, 359, 370, 384, 510, 553, 557, 595, 596; 264/284, 293; 430/50, 97, 939

(56) References Cited

U.S. PATENT DOCUMENTS

| 2,585,915 | A | | 2/1952 | Chavannes | 264/284 |
| 3,689,346 | A | | 9/1972 | Rowland | 156/245 |
| 3,897,247 | A | * | 7/1975 | Schadlich et al. | 430/1 |
| 4,191,451 | A | | 3/1980 | Hodges | 359/452 |
| 4,374,077 | A | * | 2/1983 | Kerfeld | 264/1.33 |

(List continued on next page.)

FOREIGN PATENT DOCUMENTS

| DE | 44 21 559 A1 | 12/1995 |
| EP | 0 130 659 A1 | 1/1985 |
| EP | 0 228 671 A1 | 7/1987 |
| JP | 58000268 | 1/1983 |
| WO | WO 80/01472 | 7/1980 |
| WO | WO 90/15673 A1 * | 12/1990 |
| WO | WO 90/15673 | 12/1990 |
| WO | WO 98/21626 | 5/1998 |
| WO | WO 98/28729 | 7/1998 |
| WO | WO 0/00563 A1 | 1/2000 |
| WO | WO 00/73083 A1 | 12/2000 |

OTHER PUBLICATIONS

Definition of "actinic (rays)" from Hackh's Chemical Dictionary, 4th Edition, (c) 1969 by McGraw–Hill, Inc., p. 15.*
Darren Hitchcock, "Microvias, High Speed, and Flex," Proc. IPC Natl. Conf. on Flexible Circuits, May 19–20, 1987 (Phoenix, AZ).
Charles Lassen, "Build–Up Multilayers," Printed Circuit Fabrication 20 (6), Jun. 1997, pp. 22–24.
Charles E. Bauer, "Using Chip Scale Packages," Advanced Packaging 5 (4), Jul./Aug. 1996, pp. 8–10.
Howard Green and Phillip Garrou, "Introduction to Large Area Substrate Processing," Advancing Microelectronics 24 (2), Mar. /Apr. 1997, pp. 10–15.

Primary Examiner—Shrive P. Beck
Assistant Examiner—William Phillip Fletcher, III
(74) Attorney, Agent, or Firm—Richard Francis (57) ABSTRACT

A composite article having large scale predictable dimensional stability comprises a metal foil backing having adhered thereto a layer of cured polymer having an exposed surface bearing a three-dimensional microstructure of precisely shaped and located functional discontinuities. The article is made by depositing a layer of a radiation curable composition onto a metal foil backing, contacting a master with a pattern capable of imparting a three-dimensional microstructure of precisely shaped and located functional discontinuities into the layer of radiation curable composition, while the layer of radiation curable composition is in contact with the master, exposing the curable composition to radiation to cure the composition, and separating the cured polymer layer on the metal foil backing from the surface of the master. Either the metal foil backing or the master may be radiation transmissive.

14 Claims, 5 Drawing Sheets

U.S. PATENT DOCUMENTS

| | | | |
|---|---|---|---|
| 4,414,316 A | 11/1983 | Conley | 430/496 |
| 4,560,578 A | 12/1985 | Freeman | |
| 4,566,927 A * | 1/1986 | Wood | 156/203 |
| 4,576,850 A | 3/1986 | Martens | 428/156 |
| 4,582,885 A | 4/1986 | Barber | 528/28 |
| 4,668,558 A | 5/1987 | Barber | 428/156 |
| 4,810,435 A | 3/1989 | Kamada et al. | 264/495 |
| 4,920,038 A | 4/1990 | Budde et al. | 430/315 |
| 5,175,030 A | 12/1992 | Lu et al. | 428/30 |
| 5,183,597 A | 2/1993 | Lu | 264/1.38 |
| 5,260,175 A | 11/1993 | Kowanz et al. | 430/326 |
| 5,330,799 A | 7/1994 | Sandor et al. | 427/510 |
| 5,468,542 A | 11/1995 | Crouch | 428/215 |
| 5,754,332 A | 5/1998 | Crowley | 359/296 |
| 5,773,126 A | 6/1998 | Noritake et al. | |
| 5,815,306 A | 9/1998 | Sheridon et al. | 359/296 |
| 5,847,327 A | 12/1998 | Fischer et al. | 174/258 |
| 6,358,442 B1 * | 3/2002 | Delaney et al. | 264/1.31 |

* cited by examiner

METHOD OF MAKING DIMENSIONALLY STABLE COMPOSITE ARTICLE

FIELD OF THE INVENTION

The present invention relates generally to a composite article having large scale predictable dimensional stability comprised of a metal foil backing having adhered thereto a layer of cured polymer having an exposed front surface bearing a three-dimensional microstructure of precisely shaped and located functional discontinuities and to a method of making such an article.

BACKGROUND OF THE INVENTION

There exists a need for a flexible, sheet-like composite article which has large scale predictable dimensional stability. That is, a significant segment of the article should have the ability to avoid substantial unpredictable dimensional alteration after being subjected to extreme conditions such as heat, cold and moisture upon return to ambient conditions. Such products will undergo only minor predictable variation in dimension when subjected to such environmental conditions. Predictability refers to the expected change in dimensions based on an understanding of inherent properties of materials to irreversibly shrink or expand after exposure to certain environmental conditions and return to ambient conditions.

Products of this type find utility in such fields as photolithography, the manufacture of flexible circuitry, etching, plating, and vapor deposition. Other utilities include the manufacture of "egg crate" substrates for gyricon rotating-particle displays as disclosed in U.S. Pat. No. 5,815,306 (Sheridon, et al.).

Such predictably dimensionally stable composite articles should meet the dimensional stability requirements for fine-pitch electronic circuits. Fine pitch electronic circuits find applicability in electronic chip packaging, i.e., so-called "first-level" packaging as the intermediary between the silicon chip and other external circuitry. Fine pitch electronic circuits are also used as printed circuit boards to which pre-packaged chips are attached, and other electronic interconnect devices, especially where minimization of component size and/or weight are important.

The so-called Built-Up Multilayer (BUM) process, used for packaging and connecting electronic chips, starts with a core, typically metal foil laminated to both sides of a dielectric layer, or metal deposited onto the dielectric core. The BUM process is practiced in several versions, differentiated by the techniques used for applying successive layers of dielectric and metal, and by the techniques used to define the vias. See, for example, Charles E. Bauer, "Using Chip Scale Packages," Advanced Packaging 5 (4), July/August 1996, pp. 8–10; Howard Green and Phillip Garrou, "Introduction to Large Area Substrate Processing," Advancing Microelectronics 24 (2), March/April 1997, pp. 10–15; Charles Lassen, "Build-Up Multilayers," Printed circuit Fabrication 20 (6), June 1997, pp. 22–24; and Darren Hitchcock, "Microvias, High Speed, and Flex," Proc. IPC Natl. Conf. on Flexible Circuits, May 19–20, 1997 (Phoenix, Ariz.). Via formation technologies in common practice include: direct photolithographic patterning of photosensitive dielectrics, pattern-wise laser ablation, and chemical milling or plasma ablation through patterned resist or metallization.

A common shared element is the need to have a predictably dimensionally stable substrate, so that the patterning of the several layers of material in the multilayer structure (dielectric and metal) will be aligned layer to layer. To achieve nominal 25 µm line and 25 µm space, as would be required for chip-scale packaging, the individual layers of patterned metallization and of vias (holes) in the dielectric need to be aligned to better than ±50% the spacing, i.e., better than ±12.5 µm to an absolute reference point (fiducial mark). The core or base material upon which the multilayers are built needs to have dimensional stability at least this good, if not better. The preparation of larger scale predictably dimensionally stable composite articles provides the way to reduce the per unit cost of products made from smaller segments of such articles.

Identification of Related Art

The following references are relevant to the invention:

U.S. Pat. No. 3,689,346 (Rowland);
U.S. Pat. No. 4,576,850 (Martens);
U.S. Pat. No. 4,414,316 (Conley);
U.S. Pat. No. 5,175,030 (Lu and Williams);
WO9015673 (Kerr and Crouch);
EP-130659 (Brown); and
U.S. Pat. No. 4,810,435 (Kamada, et al.)

SUMMARY OF THE INVENTION

The present invention provides a composite article which has large scale predictable dimensional stability which is comprised of a metal foil backing having adhered to one surface thereof a layer of radiation cured polymer having an exposed front surface bearing a three-dimensional microstructure of precisely shaped and located functional discontinuities. The functional discontinuities include distal surface portions and adjacent depressed surface portions. The polymer layer includes an opposite surface adhered to one surface of the backing. The composite article provides a predictably dimensionally stable sheet-like article which finds utility in any of a wide variety of uses where dimensional stability is important.

The basic unit of the patterned polymer layer and the metal backing is predictably dimensionally stable, thereby providing a larger dimensionally stable composite article to provide process efficiency which leads to cost reduction per unit part. The combination of the patterned dielectric and metal foil is predictably dimensionally stable, making it possible to stack multiple layers together in register, to form multilayer circuits which are functionally similar to printed circuit boards. Two or more of the substrates may be prepared and conjoined to form more complex electronic circuits than would be possible by using only one layer alone.

The articles of the invention have the needed predictable dimensional stability to provide these features. Articles according to the present invention are characterized by having predictable dimensional change after exposure to heat at 150° C. or less for one hour or less and return to ambient conditions of less than about 100 parts per million (ppm), preferably less than about 60 ppm and most preferably less than about 50 ppm. That is, at 100 ppm the articles according to the invention will have a dimensional deviation of less than 10 µm per 100 mm spacing between a designated original reference point and any fiducial mark spaced 100 mm therefrom on the sheet being evaluated.

In one aspect, the invention provides a method of making a composite article having large scale predictable dimensional stability, said method comprising:

a. depositing a layer of a radiation curable composition onto one surface of a radiation transmissive metal foil backing to provide a layer having an exposed surface;

b. contacting a master with a preformed surface bearing a pattern capable of imparting a three-dimensional microstructure of precisely shaped and located functional discontinuities including distal surface portions and adjacent depressed surface portions into the exposed surface of the layer of radiation curable composition on said metal foil backing under sufficient contact pressure to impart said pattern into said layer, wherein preferably after such contact at least one portion of the polymer layer will include a distal surface portion distally spaced at least 0.05 mm from an adjacent depressed surface portion;

c. while the layer of radiation curable composition is in contact with the patterned surface of the master, exposing the curable composition to a sufficient level of radiation through the metal foil backing to cure said composition to provide a cured polymer which adheres to the metal foil backing; and d. separating the cured polymer layer on the metal foil backing from the surface of the master.

In a further aspect, the invention provides a method of making a composite article having large scale predictable dimensional stability, said method comprising:

a. depositing a layer of a radiation curable composition onto one surface of a metal foil backing to provide a layer having an exposed surface;

b. contacting a radiation transmissive master with a preformed surface bearing a pattern capable of imparting a three-dimensional microstructure of precisely shaped and located functional discontinuities including distal surface portions and adjacent depressed surface portions into the exposed surface of the layer of radiation curable composition on said metal foil backing under sufficient contact pressure to impart said pattern into said layer, wherein preferably after such contact at least one portion of the polymer layer will include a distal surface portion distally spaced at least 0.05 mm from an adjacent depressed surface portion;

c. while the layer of radiation curable composition is in contact with the patterned surface of the master, exposing said composition to a sufficient level of radiation through the master to cure said composition to provide a cured polymer which adheres to the metal foil backing; and d. separating the cured polymer layer on the metal foil backing from the surface of the master.

In a further aspect, the invention provides a method of making a composite article having large scale predictable dimensional stability, said method comprising:

a. depositing a layer of a radiation curable composition onto one surface of a radiation transmissive metal foil backing to provide a layer having an exposed surface;

b. contacting a master with a preformed surface bearing a pattern capable of imparting a three-dimensional microstructure of precisely shaped and located interactive functional discontinuities including distal surface portions and adjacent depressed surface portions into the exposed surface of the layer of radiation curable composition on said metal foil backing under sufficient contact pressure to impart said pattern into said layer;

c. while the layer of radiation curable composition is in contact with the patterned surface of the master, exposing said curable composition to a sufficient level of radiation through the metal foil backing to cure said composition to provide a cured polymer which adheres to the metal foil backing; and d. separating the cured polymer layer on the metal foil backing from the surface of the master.

In a further aspect, the invention provides a method of making a composite article having large scale predictable dimensional stability, said method comprising:

a. depositing a layer of a radiation curable composition onto one surface of a metal foil backing to provide a layer having an exposed surface;

b. contacting a radiation transmissive master with a preformed surface bearing a pattern capable of imparting a three-dimensional microstructure of precisely shaped and located interactive functional discontinuities including distal surface portions and adjacent depressed surface portions into the exposed surface of the layer of radiation curable composition on said metal foil backing under sufficient contact pressure to impart said pattern into said layer;

c. while the layer of radiation curable composition is in contact with the patterned surface of the master, exposing said composition to a sufficient level of radiation through the master to cure said composition to provide a cured polymer which adheres to the metal foil backing; and d. separating the cured polymer layer on the metal foil backing from the surface of the master.

The invention also provides a composite article having large scale predictable dimensional stability comprising:

a. a metal foil backing having a back surface and an opposite front surface; and b. a layer of a radiation cured polymer having an exposed front surface bearing a three-dimensional microstructure of precisely shaped and located functional discontinuities including distal surface portions and adjacent depressed surface portions and an opposite surface in adherent contact with the front surface of said backing, wherein preferably at least one portion of the polymer layer includes a distal surface portion distally spaced at least 0.05 mm from an adjacent depressed surface portion.

In a further aspect, the composite article of the invention having a large scale predictable dimensional stability comprising:

a. a metal foil backing having a back surface and an opposite front surface; and b. a layer of a radiation cured polymer having an exposed front surface bearing a three-dimensional microstructure of precisely shaped and located interactive functional discontinuities including distal surface portions and adjacent depressed surface portions and an opposite surface in adherent contact with the front surface of said backing.

The metal foil forming the backing of the composite article of the invention may be comprised of any metal which will withstand the process conditions described in the method above and will provide predictable dimensional stability in the composite article. Preferably, the metal is selected from the group consisting of copper, aluminum, zinc, titanium, tin, iron, nickel, gold, silver, combinations thereof and alloys thereof. Suitable metals also include such alloys as brass and steel, including stainless steel.

Preferred metal foils are e-beam radiation transmissive to permit cure of the curable composition through the metal foil backing in any method which includes this step.

The preferred curable composition is a curable oligomeric resin.

The radiation source for curing the curable composition to form the cured polymer may be electron beam (e-beam) radiation, actinic (uv or visible) radiation or thermal radiation.

The depressed areas may take any of a variety of shapes which include shapes for receiving and holding complementary shaped articles such as gyricon spheres and conductive spheroids. The microstructure may also be shaped to provide an article which is useful as an etch mask.

Definitions

The following definitions apply to the invention described herein.

The term "precisely shaped and located functional discontinuities" refers to shapes that are made by predeterminably replicating substantially the inverse configuration borne on a master which has been endowed with original, non-random, precise functional shapes which are precisely located relative to each other and this term is intended to exclude shapes that are merely decorative or randomly textured to provide a frictional surface.

The term "precisely shaped interactive functional discontinuities" refers to shapes as defined above which, after formation, are capable of forming cooperative mechanical arrangements with other complementarily shaped objects.

The term "large scale predictable dimensional stability" refers to the ability of a segment of shaped sheet-like substrate to retain substantially its predicted dimensions after being subjected to a heated environment of 150° C. or less for 60 minutes or less and then returned to ambient temperature. A segment of such a substrate will generally have substantially all pre-heat and post-heat radial measurements vary by less than about 100 ppm, preferably less than about 60 ppm.

The term "metal foil" refers to a thin continuous sheet of metal.

The term "radiation-transmissive metal foil" refers to a metal foil that has the ability to permit the passage of radiation energy therethrough from an energy source such as an electron beam (sometimes referred to as "e-beam") source, gamma ray source or a thermal energy source.

The term "cured" in reference to polymers refers to polymers made by cross-linking liquid, flowable or formable monomeric or oligomeric precursors by application of an appropriate energy source to produce a solid material by various means including free-radical polymerization, cationic polymerization, anionic polymerization and the like.

The term "cured oligomeric resin" refers to polymeric materials made by curing certain curable compositions comprising prepolymeric materials having at least two repeating monomeric units which may be mixed with other monomeric materials as described in U.S. Pat. No. 4,576,850 (Martens), incorporated herein by reference.

DETAILED DESCRIPTION

Figure 1:
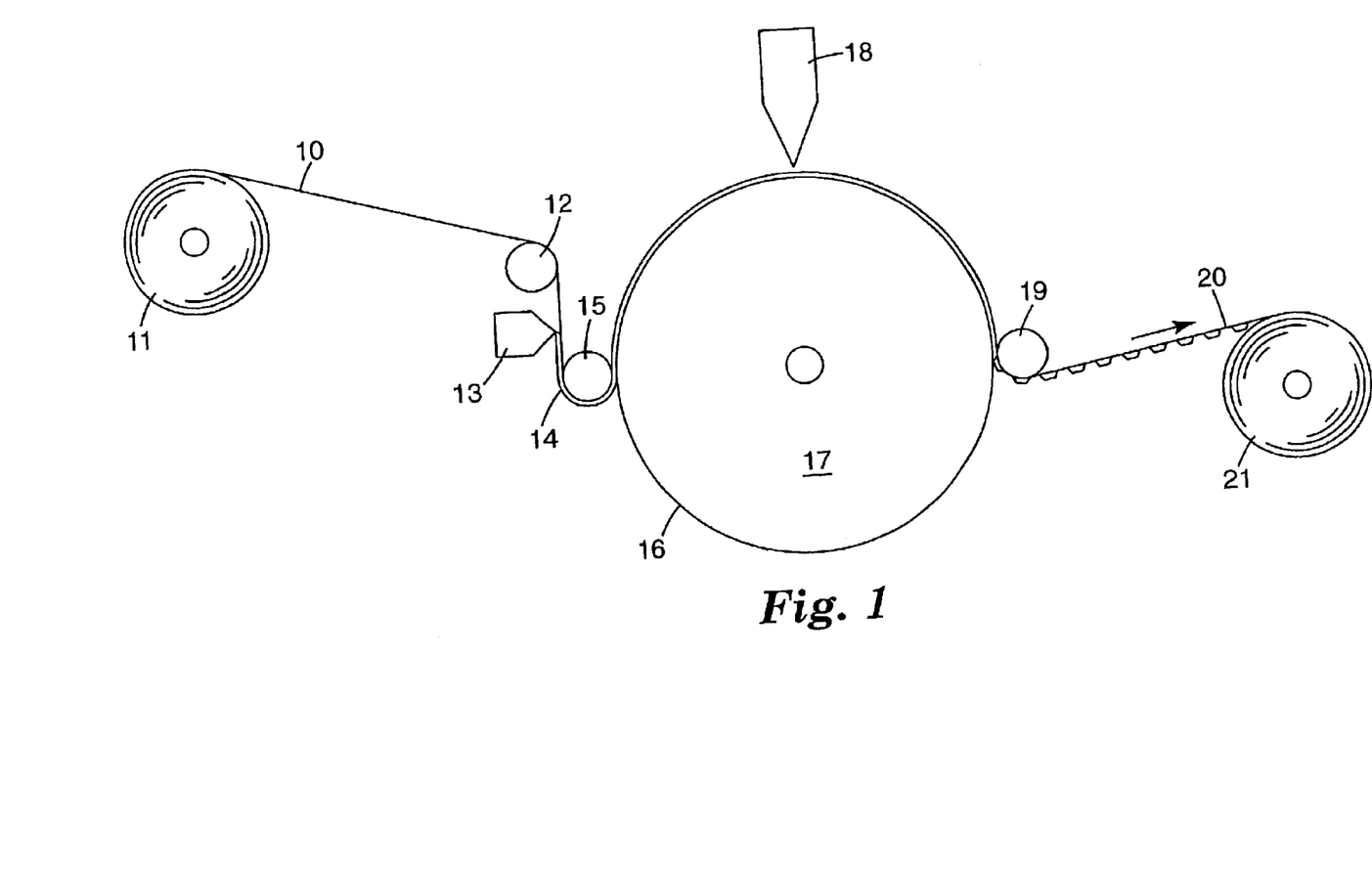
FIG. 1 is a schematic representation of one process for making the dimensionally stable composite article according to the invention by radiation exposure through the backing.

FIG. 1 is an illustration of a process for making the product of the invention. In the process depicted in FIG. 1, metal foil 10 is unwound from storage roll 11 and conducted over idler roll 12 past extrusion coater 13 which applies curable composition coating 14 to the underside of foil 10. The coated foil is then conducted over nip roll 15 so that it makes contact with the patterned surface 16 of master roll 17. Master roll 17 may have a heat exchange fluid circulated therethrough to maintain the temperature of the curable composition above, at or below ambient temperature. Sufficient pressure is applied between nip roll 15 and patterned surface roll 17 to fill any depressions in pattern 16 carried on the surface of roll 17. The combined assemblage is then passed beneath radiation curing station 18 where e-beam radiation is conducted through metal foil backing 10 at a sufficient level to effect curing of the curable composition in layer 14. The backing bearing the cured polymer layer is then conducted around idler roll 19 and stripped away from the patterned surface 16 of master roll 17 as composite article 20 which bears a polymer layer with a microstructured surface as described above. Composite article 20 is then wound onto storage roll 21 for future conversion to particular products.

The metal foil backing 10 may be any metal foil which will survive the process described above and will permit the passage of e-beam radiation to facilitate curing of curable composition layer 14 and also provide the needed predictable dimensional stability in the composite article. The metal from which foil backing 10 is constructed may be selected from any usefull metal including, for example, copper, aluminum, zinc, titanium, tin, iron, nickel, gold, silver, combinations thereof and alloys thereof. Suitable alloys include brass, steel and stainless steel. A preferred metal foil backing is formed of copper. A preferred commercially available metal foil backing is that available under the trade designation COPPERBOND™ one (1) ounce foil from Somers Thin Strip, Inc., a division of Olin Foils, Inc., Waterbury, Conn. The COPPERBOND™ 1 ounce copper foil has a nominal thickness of 37–38 $\mu$m and a roughened surface because of its manufacturing process which makes it well suited for use as a backing.

The metal foil preferably has a thickness of at least about 10 micrometers to provide sufficient strength and preferably does not exceed about 50 micrometers so that it permits the passage of sufficient radiation to permit curing of layer 14 and so that it is not undesirably stiff for future applications. It should be noted, however, that some applications may require a stiffer backing and in such cases, thicknesses in excess of 50 micrometers may be suitable if the backing will permit passage of sufficient radiation to facilitate curing.

Backing widths may vary depending on the equipment used and depending on the ultimate product size which is required by the maker. The backing may be as narrow as 2 centimeters, or narrower, and may be as wide as 1 meter, or more. The product of the invention may be slit for uses which require relatively narrow parts, such as in small electronic devices.

The curable composition and metal foil backing are selected to obtain adequate adhesion between the resulting cured polymer and the foil backing upon which it has been cured. The adequacy of adhesion will depend on the intended utility of the composite article. Some applications may only require a small degree of adhesion while others require a high degree of adhesion. The COPPERBOND copper foil is preferred because it has a rough surface due to its manufacturing process. It is believed that this roughened surface provides a mechanical interlocking with the cured resin. Relatively smooth surfaced metal foil backings may be used if the surface has been pretreated with a primer or coupling agent, as is well-known in the art, if high degrees of adhesion are required between the cured polymer and the foil backing. The curable composition may also have additives which promote adhesion to metal surfaces. Examples of such additives include complexing agents, coupling agents, and the like. For disclosure of the use of coupling agents, see, for example, "Silane Coupling Agents, 2nd Ed.", by E. P. Plueddemann, Plenum Press, New York, 1991. Epoxy resins typically adhere better to metals than acrylate resins and thus are preferred for some applications. Different applications may require different levels of adhesion under varying environmental challenges of temperature, humidity, oxidation, etc. It is well within the ability of one skilled in the art to select the particular combination of metal foil, surface preparation, and curable composition for any particular application.

Any suitable coating technique may be utilized to apply the curable composition to provide layer 14. Suitable coating techniques include knife coating, roll coating, extrusion coating, curtain coating, spraying and the like. The coating composition, for the application depicted in FIG. 1, should have a sufficiently high viscosity so that it substantially retains its initial coated thickness without flowing. Coating composition viscosities on the order of 1000 cps to 5000 cps are preferable, as measured with a Model HAT SYNCHRO-ELECTRIC viscometer (commercially available from Brookfield Engineering Laboratories, Stoughton, Mass.) using a No. 6 spindle rotated at 100 rpm at a temperature of 20° C. The curable composition may be heated to decrease its viscosity and to aid in the coating process.

The master roll has a patterned surface which is the inverse of the surface which is to be embossed into the surface of layer 14. Such master rolls are known in the art and they may be prepared by any of several well-known techniques known to those skilled in the art, depending upon the tool material and the features desired. Illustrative techniques for providing the patterned surface of the master roll include, for example, chemical etching, mechanical etching, ablative methods such as laser ablation or reactive ion etching, photolithography, stereolithography, micromachining, knurling (for example, cutting knurling or acid enhanced knurling), scoring or cutting, and the like. For disclosure of precision forming operations, see, for example, "Nanotechnology", N. Taniguchi, Ed., Oxford University Press, Oxford, 1996, and references noted therein.

The patterned surface of the master roll is characterized by including distal surface portions which will make depressed surface portions in layer 14 and depressed surface portions which will be reproduced as distal surface portions in layer 14. The distal surface portions will typically be adjacent depressed surface portions and will preferably be separated distally for certain applications by at least 0.05 mm.

The various topographical features in the pattern on the master roll are characterized by being precisely shaped and precisely located from one another. That is, they are shaped according to a detailed prearranged plan and similarly located according to the same plan on the surface of the master roll.

The radiation source 18 preferably is a device which emits electron beam (e-beam) radiation at a level which is sufficient to cure the curable composition layer 14 contained on foil backing 10. A suitable device for this purpose is that sold under the trade designation ELECTRO CURTAIN Electron Beam Line commercially available from Energy Sciences, Inc., Woburn, Mass. The e-beam radiation source is spaced sufficiently close to backing 10 to facilitate adequate curing of the composition of layer 14. Typically this is on the order of 5 centimeters, as recommended by the manufacturer.

The curable composition of layer 14 is comprised of a binder precursor that is capable of being cured by radiation energy, preferably radiation energy from ultraviolet light or visible light (actinic light) or electron beam radiation. Other sources of energy may include gamma ray, infra red, thermal and microwave sources. The energy source should be selected to provide a sufficient energy source to cure the composition without damaging the cured polymer or the master tool. Examples of binder precursors that are capable of being polymerized by exposure to radiation energy include acrylate functional monomers, acrylated urethanes, acrylated epoxies, ethylenically unsaturated compounds, aminoplast derivatives having pendant unsaturated carbonyl groups, isocyanurate derivatives having at least one pendant acrylate group, isocyanate derivatives having at least one pendant acrylate group, vinyl ethers, epoxy resins and combinations thereof The term "acrylate" includes acrylates and methacrylates.

It should be noted that many curable compositions, once cured in contact with a master, will form a three-dimensional microstructure of precisely shaped and located functional discontinuities having original dimensions. That is, when a set of separated fiducial marks is introduced from the master into the surface of a segment of the cured polymer on a metal foil backing, the marks will have an original spacing from one another. After heating the segment of the marked cured polymer borne on the metal foil backing to a high temperature, e.g., 150° C., for a designated period of time, e.g., one (1) hour, and cooling the segment to ambient conditions one typically sees with a specific set of foil backing and curable composition a shrinkage of the polymer coating. This results in a reduction in the distance between the reference fiducial and designated fiducials on the sample segment. This is thought to result from relaxation of stresses in the polymer and/or evolution of volatile residual materials contained in the cured polymer. The net result is a known or predictable shrinkage in dimensions of the polymer structure. Such a shrinkage will typically vary, depending upon the particular polymer and the additive materials contained in the curable composition forming the polymer. As used herein, the term "predictable" dimensional stability is intended to take into account such shrinkage because the master is easily made oversized to produce predictable dimensions in the cast polymer after the elevated heating. Thus, even if some shrinkage takes place in the cast polymer dimensions, the resultant composite product is designated as being predictably dimensionally stable since the shrinkage may easily be compensated for by appropriate increases in the dimensions of the topography of the master. With other choices of foil backing and curable composition, one may see predictable expansion. Predictable changes may be the same or different in different directions, i.e., cross-web and down-web. Also within the scope of this invention are random changes that are less than 100 ppm, preferably less than 60 ppm, and most preferably less than 50 ppm.

Preferred curable compositions comprise a mixture of an aliphatic urethane acrylate oligomer such as that available under the trade designations PHOTOMER 6010 (having a molecular weight of 1500) or PHOTOMER 6210 (having a molecular weight of 1400) obtained from Cognis, Ambler, Pa. with one or more acrylate monomers, such as tetrahydrofurfuryl acrylate monofunctional monomer available under the trade designation SR 285 or 1,6-hexanediol diacrylate difunctional monomer having a molecular weight of 226 available under the trade designation SR 238 from Sartomer Company, Exton, Pa. A preferred mixture is a blend of PHOTOMER 6010 oligomer and SR 285 monomer in an 80:20 weight ratio. An additional preferred mixture is a blend of PHOTOMER 6210 oligomer and SR 238 monomer in an 80:20 weight ratio.

Electron beam radiation, which is also known as ionizing radiation, can be used at a dosage of about 1 to 200 kGy, preferably at a dosage of about 10 to 120 kGy. Actinic radiation refers to ultraviolet or visible radiation. Ultraviolet radiation refers to non-particulate radiation having a wavelength within the range of about 200 to 400 nanometers, preferably within the range of about of 250 to 400 nanometers. One preferred source of ultraviolet radiation is provided by ultraviolet lamps operating in a range of about 100 to 300 watts/inch (2.5 cm) of bulb length. Visible radiation refers to non-particulate radiation having a wavelength within the range of about 400 to about 800 nanometers, preferably within the range of about 400 to about 550 nanometers. When actinic radiation is used, a photoinitiator is commonly included in the curable oligomeric composition. Suitable photoinitiators and optional sensitizers are disclosed in Martens (vide supra) and are well known to those skilled in the art of radiation curing.

Figure 2:
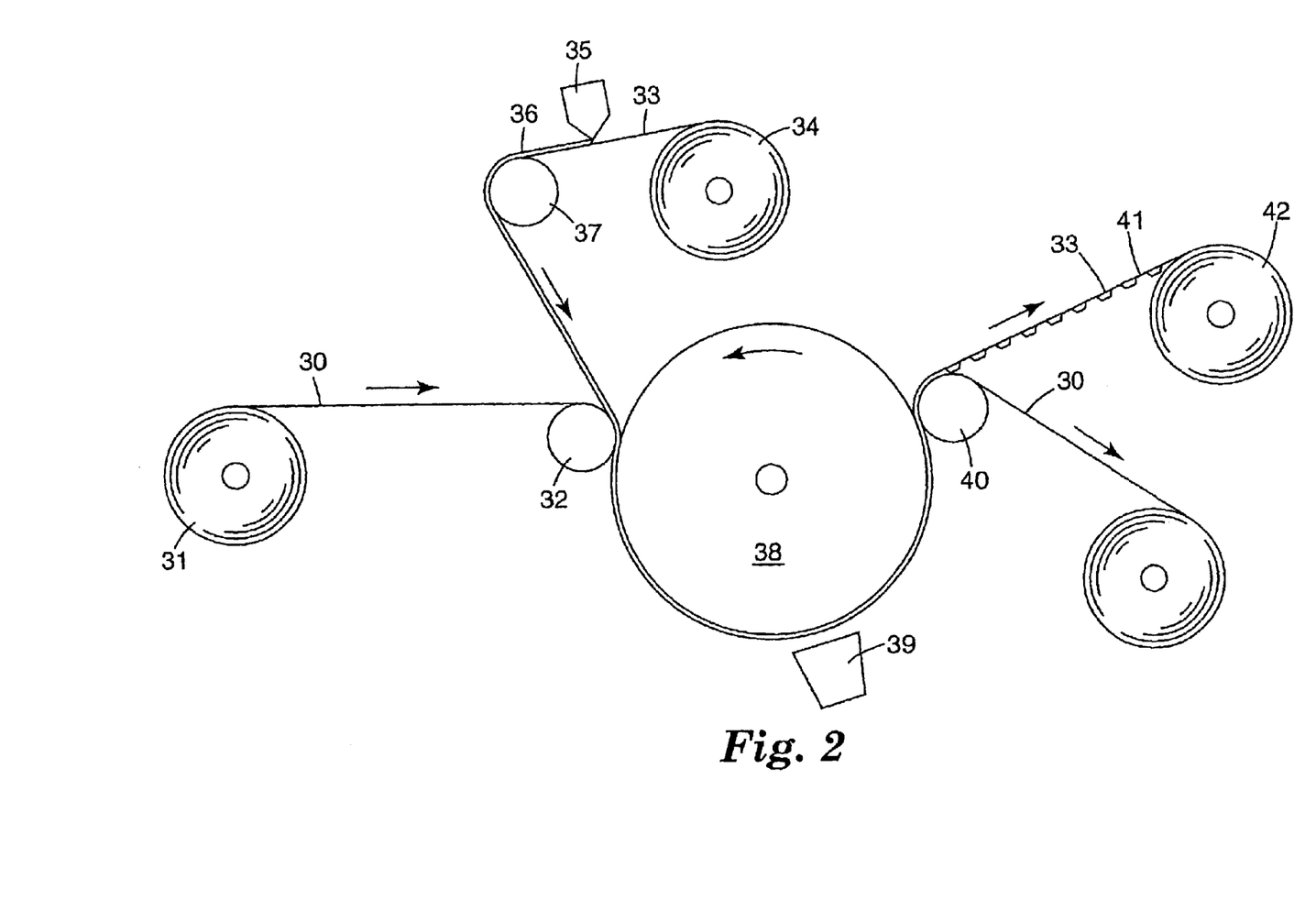
FIG. 2 is a schematic representation of another process for making the dimensionally stable composite article according to the present invention by radiation exposure through the embossing tooling.

FIG. 2 is a schematic illustration of an alternative way of making the composite product according to the invention. FIG. 2 employs a master which is in the form of a strip of material that has a surface which is patterned, as described above for the master roll. Master strip 30 is unwound from roll 31 with the patterned side deployed upwards and passed over nip roll 32. Simultaneously foil 33 is unwound from foil supply roll 34 which is passed beneath coater 35 where curable composition 36 is applied to foil backing 33 and the coated backing is passed over idler roll 37 and the coated backing and master strip 30, both moving at the same rate, simultaneously converge at the nip between nip roll 32 and backup roll 38 where sufficient roll to roll contact pressure is applied so that coating 36 conforms to the pattern borne on master strip 30. Backup roll 38 preferably includes a liquid circulation system to circulate a heat exchange fluid to maintain the temperature of the curable composition below, at or above ambient temperature. The curable mixture may be coated onto the master 30 before it contacts nip roll 32. It is preferred, however, to coat substrate 33 to minimize the possibility of damage to master 30 by accidental contact with the coating equipment. The combined backing, coating and master strip are then exposed to radiation, preferably ultraviolet radiation, by radiation source 39 which supplies a sufficient level of energy through the master strip to cure the curable composition in layer 36. Thereafter, the assemblage is conducted around idler roll 40 where the master strip 30 is stripped away from the microstructured polymer layer borne on backing 33 to provide product 41 which is characterized by including a metal foil backing bearing a microstructured polymer layer. Composite product 41 is then wound on storage roll 42 for later conversion to future products.

In the method depicted in FIG. 2, the curable composition forming layer 36 is curable by exposure to e-beam radiation, ultraviolet radiation or visible radiation. The strip of master tool (also referred to as a production tool) is composed of a material which will not absorb an appreciable amount of radiation energy or be degraded by radiation energy. For example, if electron beam energy is used, it is preferred that the production tool not be made from a cellulostic material, because electrons will degrade cellulose. If ultraviolet radiation or visible radiation is used, the production tool should transmit sufficient ultraviolet or visible radiation, respectively, to bring about the desired level of cure.

The production tool should be operated at a velocity that is sufficient to avoid degradation by the source of radiation. Production tools that have relatively high resistance to degradation by the source of radiation can be operated at relatively lower velocities. Production tools that have relatively low resistance to degradation by the source of radiation should be operated at relatively higher velocities.

The production tool can be in the form of a belt, e.g., an endless belt, a sheet, a continuous sheet or web, a coating roll, or a sleeve mounted on a coating roll.

The surface of the production tool that will come into contact with the curable mixture has a topography or pattern, as explained above. The topography of the three-dimensional microstructure of precisely shaped functional discontinuities in the polymer layer will have the inverse of the pattern of the contact surface of the production tool. The resulting pattern in the polymer layer will include depressions and distal portions, as explained above. This may include cavities which are shaped to receive particular complementarily shaped particles or items which are capable of forming cooperative mechanical arrangements with the features of the surface of the polymer layer. The surface can include cavities which may be rectangular, circular, semicircular, triangular, square, hexagonal, etc. The walls of the cavities may be vertical or tapered and the base portions of the cavities may be hemispherical, conical or flat. The base and the wall portions may be modified to be other than smooth, for example, to include appendages and/or recesses. The distal portions of the surface may be flat with the depressed portions being cavities in a flat surface or the distal portions may have a defined shape such as hemispherical, conical, truncated conical, trapezoidal, pyramidal truncated, pyramidal and the like, depending on the ultimate desired utility.

Figure 3:
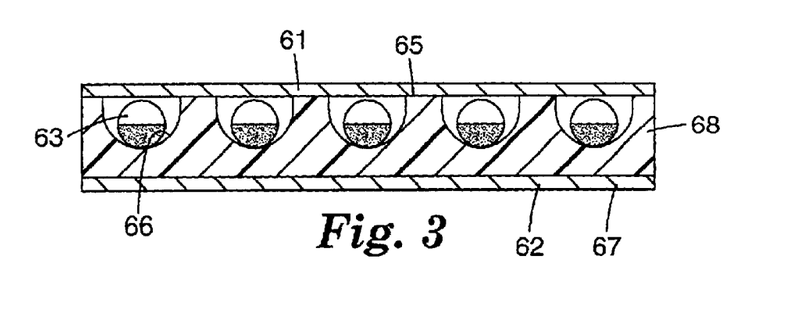
FIG. 3 is an enlarged cross-sectional view illustration of an exemplary gyricon display including gyricon particles deposited in cavities contained in a segment of the dimensionally stable composite article of the present invention.

A further utility of the composite article of the present invention is depicted in FIG. 3. FIG. 3 depicts a gyricon or twisting-ball display, as disclosed in U.S. Pat. No. 5,754,332 (Crowley), incorporated herein by reference. The display includes bichromal balls 63 which are each deployed in a cavity or well 66 formed in a polymer substrate 68 which has a flat upper surface 65 and is borne on a metal foil backing 67. Bichromal balls have a light side and a dark side, as shown in FIG. 3. Substrate 68 is swelled by a dielectric fluid contained in cavities 66 in which the balls are free to rotate. The balls are electrically dipolar in the presence of the fluid and so are subject to rotation upon application of an electric field, as by electrodes 61 and 62, respectively, 62 being provided by backing 67.

The present invention provides the cavity-bearing substrate 68 into which balls 63 will be deployed. It is highly desirable in this application to have a very dimensionally stable substrate to retain the precise deployment of the balls in the substrate. Further details of this type of article may be found in previously mentioned U.S. Pat. No. 5,754,332.

EXAMPLES

The invention is further illustrated by the following Examples wherein all parts and percentages are by weight unless otherwise indicated.

Identification of Ingredients

"COPPERBOND™ 1 ounce" foil is a copper foil having a nominal thickness of 37–38 μm obtained from Somers Thin Strip, Inc., a division of Olin Foils, Inc., Waterbury, Conn.

"COPPERBOND™ 2 ounce" foil is a copper foil having a nominal thickness of 70–74 μm.

"PHOTOMER™ 6010" is an aliphatic urethane acrylate oligomer having a molecular weight of 1500 obtained from Cognis, Ambler, Pa.

"PHOTOMER™ 6210" is an aliphatic urethane acrylate oligomer having a molecular weight of 1400 obtained from Cognis, Ambler, Pa.

"SR 285" is tetrahydrofurfuryl acrylate, a monofunctional monomer having a molecular weight of 156 available under the trade designation SR 285 from Sartomer Company, Exton, Pa.

"SR 238" is 1,6-hexanediol diacrylate, a difunctional monomer having a molecular weight of 226 available under the trade designation SR-238 from Sartomer Company, Exton, Pa.

"Resin A" is a mixture of PHOTOMER 6010 oligomer and SR 285 monomer in an 80:20 weight ratio.

"Resin B" is a mixture of PHOTOMER 6210 oligomer and SR 238 monomer in an 80:20 weight ratio.

Evaluation of Backing

Figure 4:
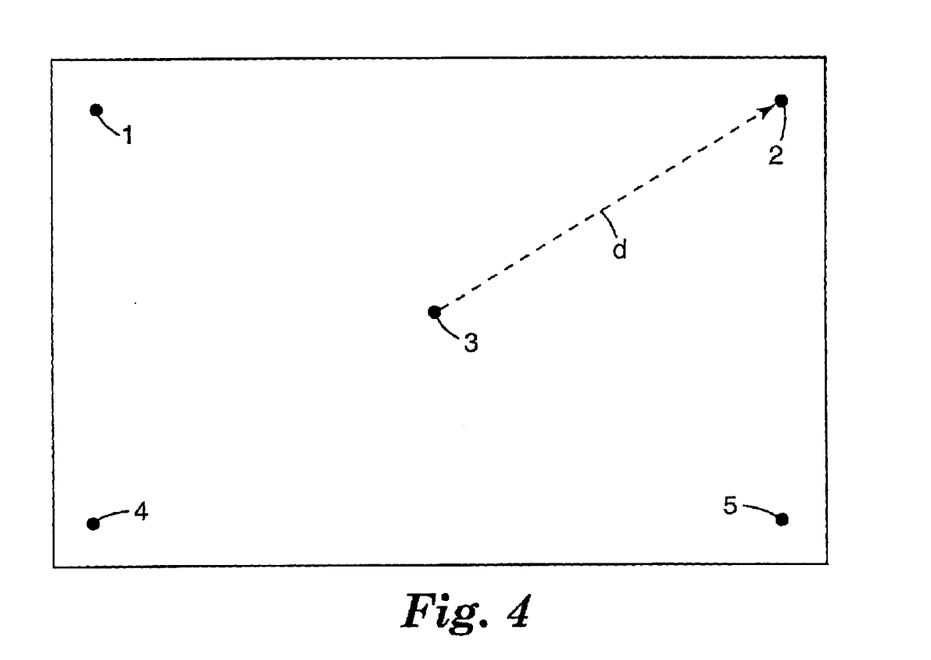
FIG. 4 is a drawing of a segment of backing bearing an array of fiducial marks.

The COPPERBOND™ one ounce copper foil was tested to determine if it is suitable as a backing for the dimensionally stable articles according to the present invention. The test involved marking each of three different 125 mm by 200 mm segments of the copper foil in 5 locations, at each corner and in the center of a 105 mm by 150 mm rectangle located in the center of the segment, with a diamond indenter employing a 500 gram load of the type utilized for testing hardness. FIG. 4 shows the locations of the marks with the center mark being noted by number 3 while the corner marks are noted as 1, 2, 4 and 5, respectively. The diamond indenter was that available under the trade designation MICRO HARDNESS TESTER from Shimadzu, Kyoto, Japan. The position of each mark on each foil segment was then measured employing a precision measuring device with a nominal horizontal resolution of 1 μm. Then the distance, d, between each pair of marks on each segment was calculated. There were a total of 10 distances calculated for each foil segment.

The test segments of copper foil were then heated in an oven at 150° C. for 1 hour after which time they were removed and allowed to equilibrate under ambient room temperature conditions. The same measurements were then repeated to determine if the heating caused any permanent distortion in the dimensions of the copper foil segments.

Table 1 shows the average of data from the three segments of the COPPERBOND™ one ounce copper foil. Column 1 is the list of the lines representing the distances between each set of marks on a segment. The identification of the line between marks 1 and 3 is noted in Table 1 as "1–3". Columns 2 and 3, respectively, set forth the average distances between each set of marks, before and after the heat treatment, of the three segments. The distance numbers are expressed in millimeters. Column 4 lists the difference between columns 2 and 3, with positive values signifying expansion and negative values signifying contraction. Finally, column 5 lists the standard deviations in the averaged data of the three foil segments.

Figure 5:
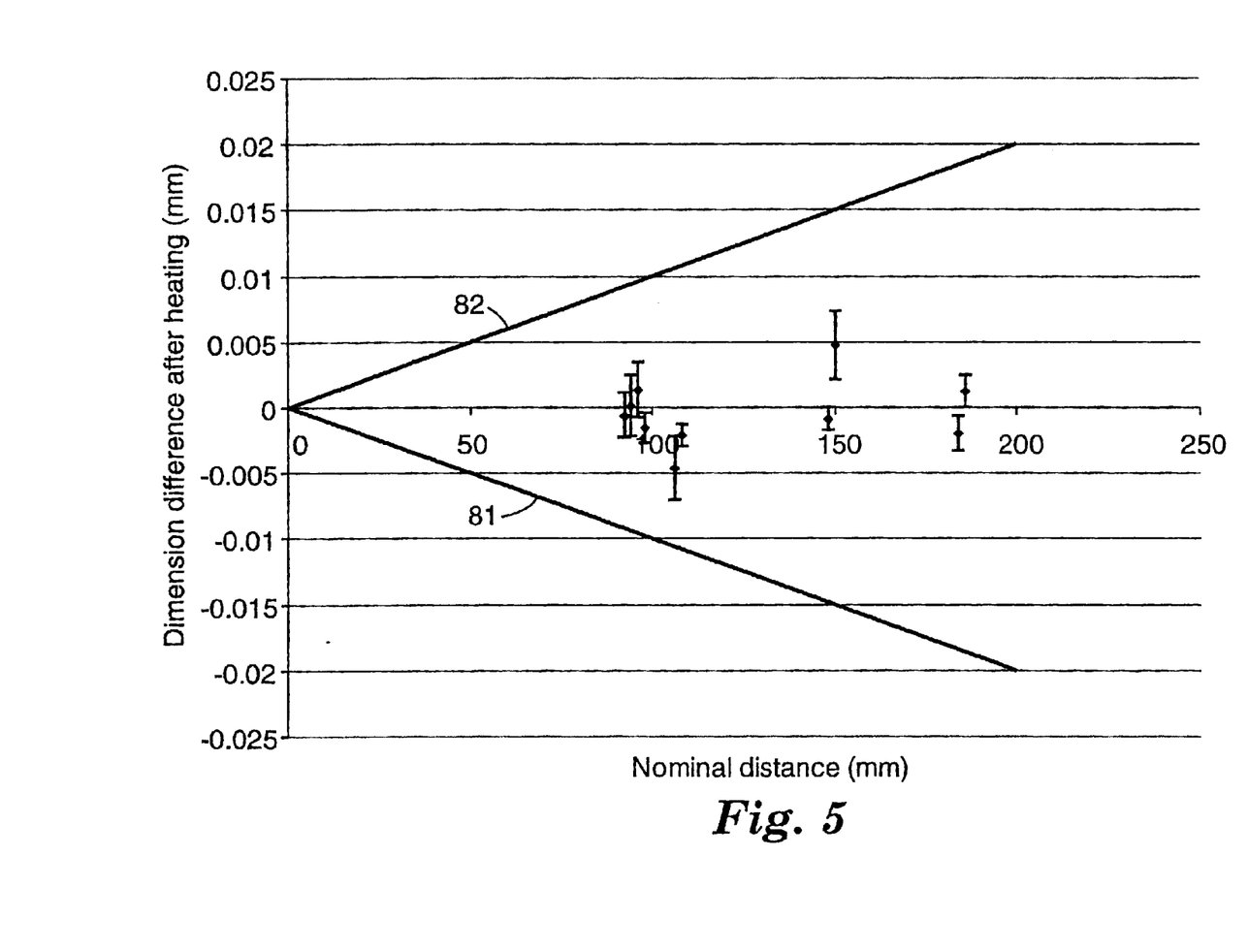
FIG. 5 is a graph showing the dimensional difference (in mm) after heating as a function of data points which are derived from measured inter-fiducial distances between the various fiducial marks shown in FIG. 4 of an uncoated copper foil backing.

FIG. 5 shows a graphical representation of the data in Table 1. The changes due to the heat treatment are plotted against the corresponding average distances between marks. Also plotted are upper and lower straight lines 82 and 81, respectively, representing the hypothetical positive 100 ppm change and negative 100 ppm change boundaries. Note that all the actual data points are well within these 100 ppm boundaries. Note also that the average of all the data is a contraction of only 5 ppm, which is probably within experimental error of zero (i.e., no change). This data shows that the copper foil is a viable substrate on which to cure resin and obtain thereby a composite film with excellent dimensional stability.

TABLE 1

| | Average | | | |
| --- | --- | --- | --- | --- |
| Calculated Distance | Before Heating (mm) | After Heating (mm) | Average Change (mm) | Std Dev Change (mm) |
| 1–2 | 151.768 | 151.767 | −0.001 | 0.001 |
| 1–3 | 91.758 | 91.757 | −0.001 | 0.002 |
| 1–4 | 105.584 | 105.580 | −0.005 | 0.002 |
| 1–5 | 182.783 | 182.781 | −0.002 | 0.001 |
| 2–3 | 93.873 | 93.873 | 0.000 | 0.002 |
| 2–4 | 187.078 | 187.079 | 0.001 | 0.001 |
| 2–5 | 107.804 | 107.802 | −0.002 | 0.001 |
| 3–4 | 93.228 | 93.229 | 0.001 | 0.002 |
| 3–5 | 91.101 | 91.099 | −0.001 | 0.001 |
| 4–5 | 150.426 | 150.431 | 0.005 | 0.003 |

Examples 1–3

Examples 1–3 were prepared by utilizing the curing technique (but not the equipment) depicted in FIG. 1 with curable compositions identified in Table 2. The coating was applied by utilizing a conventional knife coater which was gapped to provide a nominal 75 μm coating thickness. The coating was applied as a hand spread between the COPPERBOND one ounce copper foil backing and the master tool which was a flat plate rather than an embossing roll of the type depicted in FIG. 1. This assembly was taped to a polyester film which served as carrier to move the assembly under the electron beam source with exposure through the copper foil backing. Curing was accomplished by utilizing an electron beam energy source available under the trade designation ELECTROCURTAIN™ from Energy Sciences, Inc. Woburn, Mass. with the web moving at a rate of 0.1 m/sec. and an exposure of 300 kV, 120 kGy dose in a nitrogen atmosphere. The detail of each master tool is also set forth in Table 2 for each of Examples 1–3. The fidelity of the replication of the coating was measured with an optical microscope or with a profilometer available under the trade designation WYKO laser surface profilometer from Veeko Instruments, Tucson, Ariz. Replication parameters are also set forth in Table 2.

TABLE 2

| Ex. No. | Master Tool | Master Mold Resin | Master Mold Parameters | | Replica Parameters | |
|---|---|---|---|---|---|---|
| 1 | 90° vee grooves 50 μm pitch | B | Pitch (μm) Depth (μm) | 50 24 | Pitch (μm) Depth (μm) | 50 22 |
| 2 | 90° vee grooves 300 μm pitch | B | Pitch (μm) Depth (μm) | 353 175 | Pitch (μm) Depth (μm) | 354 171 |
| 3 | Square array of round posts | A | Pitch (μm) Base width (μm) Top width (μm) Height (μm) | 770 170 136 132 | Pitch (μm) Base width (μm) Top width (μm) Height (μm) | 770 163 146 131 |

Examples 1 and 2 show that features with precise slopes and pitch can be replicated. Example 3 shows that features with relatively high aspect ratio (height to diameter) and wide separation can be replicated. Any changes in dimensions related to resin shrinkage during cure can be compensated for in the original master.

Example 4

A strip approximately 200×125 mm of 2 ounce COPPERBOND™ copper foil was marked on its shiny side with indents (fiducials) as in the description of Evaluation of Backing set forth above to provide a master tool. Marking was accomplished by utilizing a diamond indenter with a 1000 gram load to make one indent in the center of the strip with an array of 4 indents arranged in a square approximately 105 mm on a side around the center. The indents were reference points. Three pieces of the 1 ounce COPPERBOND™ copper foil, each approximately 200×125 mm were then used as substrates to replicate the indents on the master. This was accomplished as in Examples 1–3 by coating each 1 ounce COPPERBOND™ copper foil with a nominal thickness of 75 micrometers of Resin B, nipping against the master and irradiating the coating in the same manner as was accomplished in Examples 1–3 through the copper foil. The positions of the replicated fiducials (now pyramids) were recorded using the measuring device described above. The samples were then heated at 150° C. for one hour, cooled to ambient conditions and remeasured. The data from the three samples was averaged and the results are reported in Table 3. Column 1 is the list of the lines representing the distances between each set of marks on a segment. The identification of the line between marks 1 and 3 is noted in Table 1 as "1–3". Columns 2 and 3, respectively, set forth the average distances between each set of marks, before and after the heat treatment, of the three segments. The distance numbers are expressed in millimeters. Column 4 lists the difference between columns 2 and 3, with positive values signifying expansion and negative values signifying contraction. Finally, column 5 lists the standard deviations in the averaged data of the three resin-coated copper foil segments.

TABLE 3

| | Average | | | |
|---|---|---|---|---|
| Calculated Distance | Before Heating (mm) | After Heating (mm) | Average Change (mm) | Std Dev Change (mm) |
| 1–2 | 104.514 | 104.515 | 0.001 | 0.002 |
| 1–3 | 74.237 | 74.232 | −0.005 | 0.005 |
| 1–4 | 105.389 | 105.383 | −0.006 | 0.007 |
| 1–5 | 145.552 | 145.543 | −0.009 | 0.004 |
| 2–3 | 77.928 | 77.927 | −0.001 | 0.004 |
| 2–4 | 150.135 | 150.130 | −0.005 | 0.006 |
| 2–5 | 105.238 | 105.232 | −0.006 | 0.003 |
| 3–4 | 72.216 | 72.212 | −0.004 | 0.002 |
| 3–5 | 71.393 | 71.390 | −0.004 | 0.001 |
| 4–5 | 103.068 | 103.060 | −0.008 | 0.009 |

Figure 6:
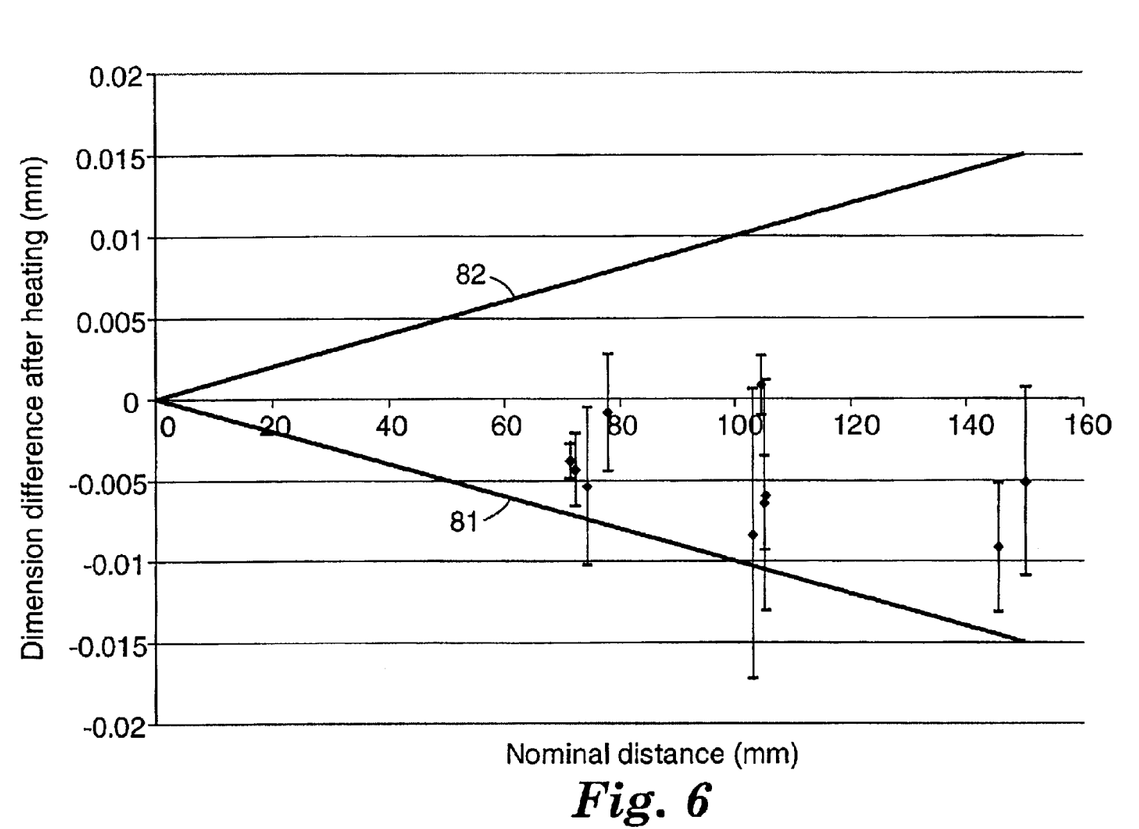
FIG. 6 is a graph showing the dimensional difference (in mm) after heating as a function of data points which are derived from measured inter-fiducial distances of the various fiducial marks shown in FIG. 4 of a polymer coated copper foil backing.

FIG. 6 shows a graphical representation of the data in Table 3. The changes due to the heat treatment are plotted against the corresponding average distances between marks. Also plotted are lower and upper straight lines, respectively, representing the hypothetical negative 100 ppm change boundary 81 and positive 100 ppm change boundary 82. Note that all the actual data points are well within these 100 ppm boundaries.

Example 5

Resin A was coated to a nominal 75 micrometer thickness on a 1 ounce COPPERBOND™ copper foil backing and on a 2 ounce COPPERBOND™ copper foil backing. The coatings were nipped between the foil and a 50 micrometer polyethylene terephthalate film and the coatings, thus arranged, were exposed through the copper foil backing to electron beam radiation delivered at 300 kV. The resulting cured coatings were tack free. The resulting coatings were analyzed for unreacted acrylic bonds by utilizing an infra red spectrometer ATR-FTIR available under the trade designation IMPACT™ 400 from Nicolet Instrument Corp., Madison, Wis. with a MULTI-BOUNCE HATR attachment available from Spectra-Tech, Inc., Shelton, Conn. The spectral region examined was from 800 to 820 cm$^{-1}$ which was chosen as being the most sensitive for determination of unreacted acrylic bonds. The test results showed that even at 215 kGy dose (the highest obtainable dose with the electron beam source being used) the level of cure through the 2 ounce COPPERBOND™ copper foil was not as high as through the 1 ounce COPPERBOND™ copper foil with an e-beam dose of only 100 kGy. This establishes that the preferred copper foil backing should be on the order of about 50 μm or less for an e-beam accelerating voltage of 300 kV.

Example 6

A master pattern was prepared by laser ablation in a 75 μm thick polyimide film available under the trade designation KAPTON polyimide film from DuPont in Wilmington, Del. The pattern consisted of rows of oval wells arranged offset by half pitch in the length direction. This pattern is useful for receiving conductive spheroids for later incorporation into z-axis conductive adhesives, as disclosed in WO 00/00563, incorporated herein by reference. This master was replicated into nickel by electroforming. The resulting metal master had oval posts with the measurements shown in Table 4 below. These measurements were obtained by using an optical microscope with a measuring stage. This metal master was replicated as in Example 1–3, using Resin A. The resulting resin/copper composite article had a pattern of wells in its surface, whose measurements are shown in Table 4. It should be noted in Table 4 that the "top width" of the master corresponds to the "bottom width" of the replica.

TABLE 4

All measurements in μm

|  | Metal Master with Posts | Ebeam Cured Replica with Wells |
|---|---|---|
| Top width | 5 | 13 |
| Top length | 14 | 22 |
| Pitch along length | 27 | 27 |
| Pitch along width | 18 | 18 |
| Depth | 10 | 11 |
| Bottom width | 13 | 5 |
| Bottom length | 22 | 13 |

Example 7

A segment of the article of Example 3 was treated in a dry etcher through a simple shadow mask (an aluminum plate with a 4×24 mm slot milled in it) until the bottoms of the wells had reached the underlying copper foil in a strip of about 5×30 wells. The dry etcher was that available under the trade designation MICRO RIE SERIES 800 from Technics, Pleasanton, Calif. operated at 300 watts with an oxygen atmosphere at 300 torr, at ambient temperature for 14 hours. Copper was vapor coated onto the segment through the same mask. The copper vapor coater was that available under the trade designation SEC-600 DUAL PHASE CRYO TORR SYSTEM from CHA Industries, Menlo Park, Calif. operated at $1 \times 10^{-6}$ torr and at 9.5 kV to first plate 0.02 μm titanium and then 1.2 μm copper. A second segment of the article of Example 3, which had not been etched, was also vapor coated with copper using the same mask. Neither etching nor vapor coating conditions were optimized. For the segment treated with both etching and vapor coating, the resistance between the resulting vapor coated pad and the copper backing was about 6 ohms, measured by simply pressing ohmmeter probes against the two sides of the segment. The resistance measured by pressing the probes of the ohmmeter together was about 6 ohms. For the segment of the article of Example 3 which had been vapor coated but not etched, the resistance between the vapor coated pad and the copper backing was greater than $10^{12}$ ohms. This shows that through vias may be created in articles of this invention. This shows that the composite articles of this invention can be used to construct electrical circuits using known methods.

The present invention has now been described with reference to several embodiments thereof. It will be apparent to those skilled in the art that many changes can be made in the embodiments described without departing from the scope of the invention. Thus, the scope of the present invention should not be limited to the structures described herein, but rather by the structures described by the language of the claims, and the equivalents of those structures.

We claim:

1. A method of making a composite article having large scale predictable dimensional stability, said method comprising:

a. depositing a layer of a radiation curable composition onto one surface of a radiation transmissive metal foil backing comprised of a thin continuous sheet of metal to provide a layer having an exposed surface;

b. contacting a master with a preformed surface bearing a pattern capable of imparting a three-dimensional microstructure of precisely shaped and located functional discontinuities including distal surface portions and adjacent depressed surface portions into the exposed surface of the layer of radiation curable composition on said metal foil backing under sufficient contact pressure to impart said pattern into said layer wherein said precisely shaped and located functional discontinuities refers to shapes, capable of forming cooperative mechanical arrangements with other complementarily shaped objects, that are made by predeterminably replicating substantially inverse configurations borne on a master which has been endowed with original, non-random, precise functional shapes which are precisely located relative to each other and excludes shapes that are merely decorative or randomly textured to provide a frictional surface;

c. while the layer of radiation curable composition is in contact with the patterned surface of the master, exposing said curable composition to a sufficient level of radiation through the metal foil backing to cure said composition to provide a cured polymer which adheres to the metal foil backing; and d. separating the cured polymer layer on the metal foil backing from the surface of the master.

2. The method of claim 1 wherein said radiation curable composition is a curable oligomeric composition.

3. The method of claim 1 wherein after such contact at least one portion of the polymer layer will include a distal surface portion distally spaced at least 0.05 mm from an adjacent depressed surface portion.

4. A method of claim 1 wherein said metal foil backing comprises a metal selected from the group consisting of copper, aluminum, zinc, titanium, tin, iron, nickel, gold, silver, combinations thereof and alloys thereof.

5. The method of claim 1 wherein said radiation is e-beam radiation.

6. The method of claim 1 wherein said radiation is thermal radiation.

7. A method of making a composite article having large scale predictable dimensional stability, said method comprising:

a. depositing a layer of a radiation curable composition onto one surface of a metal foil backing comprised of a thin continuous sheet of metal to provide a layer having an exposed surface;

b. contacting a radiation transmissive master with a preformed surface bearing a pattern capable imparting a three-dimensional microstructure of precisely shaped and located functional discontinuities including distal surface portions and adjacent depressed surface portions into the exposed surface of the layer of radiation curable composition on said metal foil backing under sufficient contact pressure to impart said pattern into said layer wherein said wherein said precisely shaped and located functional discontinuities refers to shapes, capable of forming cooperative mechanical arrangements with other complementarily shaped objects, that are made by predeterminably replicating substantially inverse configurations borne on a master which has been endowed with original, non-random, precise functional shapes which are precisely located relative to each other and excludes shapes that are merely decorative or randomly textured to provide a frictional surface;

c. while the layer of radiation curable composition is in contact with the patterned surface of the master, exposing said composition to a sufficient level of radiation through the master to cure said composition to provide a cured polymer which adheres to the metal foil backing; and d. separating the cured polymer layer on the metal foil backing from the surface of the master.

8. The method of claim 7 wherein said radiation curable composition is a curable oligomeric composition.

9. The method of claim 7 wherein after such contact at least one portion of the polymer layer will include a distal surface portion distally spaced at least 0.05 mm from an adjacent depressed surface portion.

10. The method of claim 7 wherein said metal foil backing comprises a metal selected from the group consisting of copper, aluminum, zinc, titanium, tin, iron, nickel, gold, silver, combinations thereof and alloys thereof.

11. The method of claim 7 wherein said radiation is actinic radiation.

12. The method of claim 7 wherein said radiation is thermal radiation.

13. The method of claim 7 wherein said radiation is e-beam radiation.

14. A method of making a composite article having large scale predictable dimensional stability, said method comprising:

a. depositing a layer of a radiation curable composition onto one surface of a radiation transmissive metal foil backing to provide a layer having an exposed surface;

b. contacting a master with a preformed surface bearing a pattern capable of imparting a three-dimensional microstructure of precisely shaped and located functional discontinuities including distal surface portions and adjacent depressed surface portions into the exposed surface of the layer of radiation curable composition on said metal foil backing under sufficient contact pressure to impart said pattern into said layer;

c. while the layer of radiation curable composition is in contact with the patterned surface of the master, exposing said curable composition to a sufficient level of thermal radiation through the metal foil backing to cure said composition to provide a cured polymer which adheres to the metal foil backing; and d. separating the cured polymer layer on the metal foil backing from the surface of the master.

* * * * *

UNITED STATES PATENT AND TRADEMARK OFFICE
CERTIFICATE OF CORRECTION

PATENT NO.      : 6,858,253 B2
DATED           : February 22, 2005
INVENTOR(S)     : Williams, Todd R.

It is certified that error appears in the above-identified patent and that said Letters Patent is hereby corrected as shown below:

<u>Title page,</u>
Item [56], References Cited, OTHER PUBLICATIONS, delete "1987" and insert -- 1997 --, therefor.

<u>Column 6,</u>
Line 43, delete "usefull" and insert -- useful --, therefor.

<u>Column 8,</u>
Line 33, after "thereof" insert -- . --.

Signed and Sealed this

Twenty-eighth Day of June, 2005

JON W. DUDAS
*Director of the United States Patent and Trademark Office*